(12) United States Patent
Belotserkovsky

(10) Patent No.: US 8,331,891 B2
(45) Date of Patent: Dec. 11, 2012

(54) NON-LINEAR SIGNAL DISTORTION DETECTION USING MULTIPLE SIGNAL TO NOISE RATIO MEASUREMENT SOURCES

(75) Inventor: Maxim Borisovich Belotserkovsky, Carmel, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 929 days.

(21) Appl. No.: 11/886,192

(22) PCT Filed: Mar. 24, 2006

(86) PCT No.: PCT/US2006/011254
§ 371 (c)(1),
(2), (4) Date: Sep. 11, 2007

(87) PCT Pub. No.: WO2006/102682
PCT Pub. Date: Sep. 28, 2006

(65) Prior Publication Data
US 2009/0137212 A1 May 28, 2009

Related U.S. Application Data

(60) Provisional application No. 60/664,917, filed on Mar. 24, 2005.

(51) Int. Cl.
*H04B 1/06* (2006.01)
*H04B 7/00* (2006.01)
*H04B 17/00* (2006.01)
(52) U.S. Cl. ............... 455/232.1; 455/239.1; 455/226.1; 455/226.2; 455/226.3
(58) Field of Classification Search .............. 455/77, 455/239.1, 120, 125, 226.2, 226.3, 127.2, 455/136, 138, 232.1, 63.1, 63.3, 67.11, 67.13, 455/22 6.1, 283, 296, 247.1
See application file for complete search history.

(56) References Cited

U.S. PATENT DOCUMENTS

| 4,827,511 A | 5/1989 | Masuko |
| 5,347,569 A | 9/1994 | Yamamoto |
| 5,596,605 A | 1/1997 | Kiyanagi et al. |
| 5,610,554 A | 3/1997 | Anvari |

(Continued)

FOREIGN PATENT DOCUMENTS

EP 0583968 2/1994

(Continued)

OTHER PUBLICATIONS

Lerkvaranyu et al. "ML Detection with symbol estimation for non-linear distortion of OFDM signal" vol. 2, Dec. 1, 2004, pp. 64-67, XP002394467.

(Continued)

*Primary Examiner* — Eugene Yun
(74) *Attorney, Agent, or Firm* — Robert D. Shedd; Joseph J. Opalach; Kuniyuki Akiyama

(57) ABSTRACT

A television signal processing apparatus comprising a receiver comprises a distortion estimator and an automatic gain control signal generator. The automatic gain control signal generator generates a plurality of automatic gain control and filter response control signals in response to the magnitude or signal to noise ratio of an RF signal and a non-linear distortion figure generated from the information carried by said RF signal. The distortion estimator uses a plurality of statistical methods to generate a non-linear distortion figure from the signal constellation of the information carried by said RF signal.

10 Claims, 6 Drawing Sheets

U.S. PATENT DOCUMENTS

| | | | |
|---|---|---|---|
| 6,154,503 | A | 11/2000 | Strolle |
| 6,545,532 | B1 | 4/2003 | Maalej et al. |
| 6,650,878 | B1 * | 11/2003 | Abe et al. ................... 455/232.1 |
| 2004/0207761 | A1 | 10/2004 | Paik et al. |

FOREIGN PATENT DOCUMENTS

| | | |
|---|---|---|
| EP | 0814568 | 12/1997 |
| EP | 0955744 | 11/1999 |
| JP | 1-272348 | 10/1989 |
| JP | 4-271551 | 9/1992 |
| JP | 5-292140 | 11/1993 |
| JP | 7-307717 | 11/1995 |
| JP | 8-317012 | 11/1996 |
| JP | 9-98036 | 4/1997 |
| JP | 10-65750 | 3/1998 |
| JP | 2000/031936 | 1/2000 |
| JP | 2000-286916 | 10/2000 |
| JP | 2001-102947 | 4/2001 |
| JP | 2005-210171 | 8/2005 |
| WO | WO 2004/112368 A2 | 12/2004 |
| WO | WO2004112384 | 12/2004 |

OTHER PUBLICATIONS

Search report dated Aug. 10, 2006.

Ryu, Jae Ho et al: "Combines Equalization and Nonlinear Distortion Cancellation for Transmission os QAM Signal in Fixed Wireless Channel." 2003 IEEE Int'l Conference on Acoustics, Speech, and Signal Processing. (Cat. No. 03CH37404). Pt. vol. 4, pp. IV 439-492. Piscataway, NJ USA, 2003.

Frigo, NJ: "A Model of Intermodulation Distortion in Non-Linear Multicarrier Systems." IEEE Transactions on Communications, vol. 42, No. 2-4, pt 2, pp. 1216-1222. Feb.-Apr. 1994.

Banal Are, at el. "A New Approach for Evaluating Clipping Distortion in Muiticarrier Systems."; IEEE Journal on Selected Areas in Communtcations, vol. 20, No. 5, pp. 1037-1046, Jun. 2002.

Nakamura, N. et el: "The Effect of Intermodulation Distortions on Digital Signal Transmission in Cable TV System." Journal of the Instultute of Image Information and Television Engineers; vol. 51; No. 9, pp. 1517-1526. Sep. 1997.

* cited by examiner

NON-LINEAR SIGNAL DISTORTION DETECTION USING MULTIPLE SIGNAL TO NOISE RATIO MEASUREMENT SOURCES

CROSS REFERENCE TO RELATED APPLICATION

This application claims the benefit, under 35 U.S.C. §365 of International Application PCT/US2006/11254 filed Mar. 24, 2006 which was published in accordance with PCT Article 21(2) on Sep. 28, 2006 in English and which claims the benefit of U.S. provisional patent application No. 60/664,917 filed Mar. 24, 2005.

BACKGROUND OF THE INVENTION

In a processing device of television signals it is necessary to process the radio frequency (RF) received signal before the signal is converted to a digital representation by the analog to digital converter (ADC). Such circuitry generally includes one or more amplifiers and one or more filters. Generally, a first RF gain amplifier is followed by a first out of band rejection filter, followed by a mixer for converting the signal to an intermediate frequency (IF), followed by a fixed frequency filter, such as a surface acoustic wave filter (SAW), followed by an IF gain amplifier. Those skilled in the art will recognize the need to amplify the signal prior to the SAW filter, as the latter will normally have a significant insertion loss, or attenuation, as a result. It is common to control the gain of RF or IF gain amplifiers independently using feedback gain control loops.

In an operation developed for the reception of analog television signals commonly used today in the reception of digital television signals, an analog closed-loop AGC is associated with the RF gain stage alone using an analog power detector. The detector will operate based on the total signal power. If there is a strong undesired signal present, the total power seen by the analog detector will also be higher and the detector output will drive the RF gain down, resulting in a lower desired channel power downstream. This will be sensed by an AGC generator, which will, in turn, request higher gain from the RF section. If an IF gain amplifier stage is used, the IF gain amplifier operates on a signal previously filtered by the SAW filter. In an analog television signal processing apparatus, some non-linear distortion was acceptable, whereas in a digital system, non-linear distortion can result in a level of signal corruption that is undecodable. In modern digital television signal receivers, it would be desirable to take advantage of the information available during digital signal processing to optimize the preliminary signal processing circuitry to ensure the best quality, or most receivable signal is delivered to the digital signal processing device.

SUMMARY OF THE INVENTION

In accordance with an aspect of the present invention, an apparatus for tuning an RF signal is disclosed. According to an exemplary embodiment, the apparatus is presented for utilizing information generated during digital signal processing operations to optimize the tuning and RF and IF signal conditioning operations. More specifically, said apparatus comprises a first processor for generating a first automatic gain control signal in response to a non-linear distortion figure of said RF signal.

In accordance with another aspect of the invention, a method of tuning an RF signal is disclosed. According to an exemplary embodiment, the method utilizes information generated during digital signal processing operations to optimize the tuning and RF and IF signal conditioning operation. More specifically, the method comprises the steps of receiving an RF signal, amplifying said RF signal responsive to a first automatic gain control signal, demodulating said RF signal, estimating a non-linear distortion figure of said RF signal, and adjusting said first automatic control signal in response to said non-linear distortion figure.

DESCRIPTION OF THE PREFERRED EMBODIMENTS

The exemplifications set out herein illustrate preferred embodiments of the invention, and such exemplifications are not to be construed as limiting the scope of the invention in any manner. Other than the inventive concept, the elements shown in the figures are well known and will not be described in detail. Also, familiarity with television broadcasting and receivers is assumed and is not described in detail herein. For example, other than the inventive concept, familiarity with current and proposed recommendations for TV standards such as NTSC (National Television Systems Committee), PAL (Phase Alternation Lines), SECAM (SEquential Couleur Avec Memoire) and ATSC (Advanced Television Systems Committee) (ATSC) is assumed. Likewise, other than the inventive concept, transmission concepts such as eight-level vestigial sideband (8-VSB), Quadrature Amplitude Modulation (QAM), and receiver components such as a radio-frequency (RF) front-end, or receiver section, such as a low noise block, tuners, demodulators, correlators, leak integrators and squarers is assumed. Similarly, formatting and encoding methods (such as Moving Picture Expert Group (MPEG)-2 Systems Standard (ISO/IEC 13818-1)) for generating transport bit streams are well-known and not described herein. It should also be noted that the inventive concept may be implemented using conventional programming techniques, which, as such, will not be described herein. Finally, like-numbers on the figures represent similar elements.

Assuming an AWGN (Additive White Gaussian noise) transmission channel, in digital communications the demodulated received signal can be represented as $$r(nT) = s(nT) + w(nT); n=0, 1, 2, 3, \ldots \quad (1)$$

where T is the sample time, s(nT) is the transmitted symbol, and w(nT) is the additive white Gaussian noise of the channel. As known in the art, the Gaussian distribution is defined as $$f(x) = \frac{1}{\sigma\sqrt{2\pi}} e^{-(x-\mu)^2/2\sigma^2}, \quad (2)$$

where $\sigma^2$ is the variance and $\mu$ is the mean. The above expressions apply to both I (in-phase) and Q (quadrature) data if I and Q are statistically independent.

Figure 1:
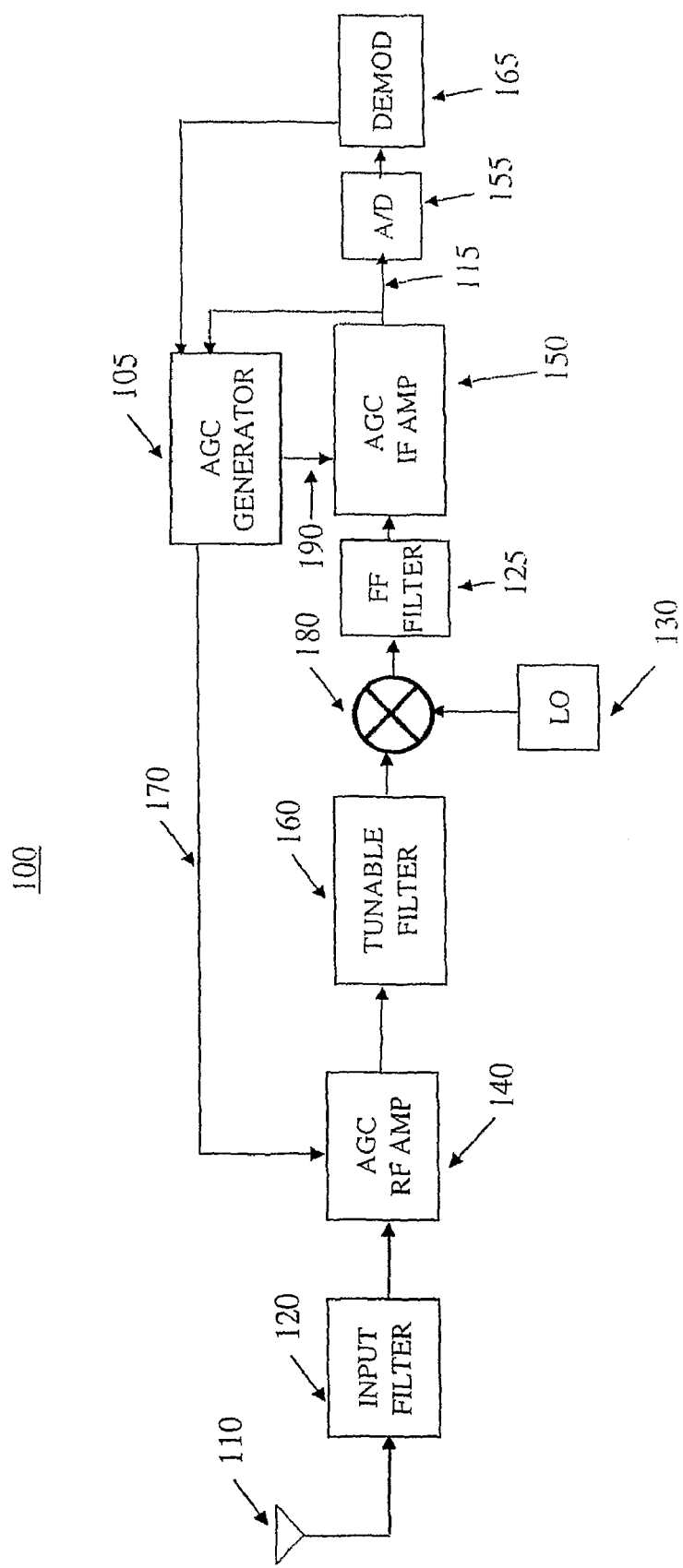
FIG. 1 is a block diagram of an exemplary embodiment of a television signal tuning apparatus for implementing the present invention.

Referring now to the drawings, and more particularly to FIG. 1, a block diagram of an exemplary embodiment of television signal tuning apparatus is shown. The apparatus comprises an input 110, an input filter 120 and automatic gain control (AGC) radio frequency (RF) amplifier 140, an tunable filter 160, a mixer 180, a local oscillator 130, a fixed frequency filter 125 an AGC intermediate frequency (IF) amplifier 150, an analog to digital converter 155, a demodulator 165 and a AGC generator 105. The AGC generator 105 processes an output from the IF AGC amplifier 155 and a control signal from the demodulator 165 to generate an RF AGC control signal 170 and an IF AGC control signal 190.

FIG. 1 shows an RF, IF and AGC circuit arrangement wherein a signal source is coupled to input 110 and filtered by input filter 120. The signal from input filter 120 is coupled to amplifier 140, the gain of which is AGC controllable. The amplified signal from amplifier 140 is coupled to an tunable filter 160 where adjacent channel signals and noise is reduced. The signal is then coupled to a mixer 180 where it is mixed with a reference frequency signal generated by local oscillator 130 for producing the IF signal at the desired IF frequency. The exact IF frequency is dependant on the channel bandwidth as related to geographical location. For example, NTSC signals in the United States and Japan have a 6 MHz channel with an IF around 44 MHz. In Europe, a PAL/SECAM signal has an 8 MHz channel with an IF around 36 MHz. The IF signal is processed by a fixed frequency filter 125 and amplified by IF AGC amplifier 150. The IF amplifier output is then coupled to AGC generator 105 to provide a responsive AGC control signal. The video output signal from the IF amplifier output is also digitized by an analog to digital (A/D) converter 155 and fed to the digital demodulator 165. The A/D converter may be integrated into some digital demodulator integrated circuits (IC).

According to the exemplary embodiment of the present invention, an IF AGC control signal is coupled to the AGC IF Amplifier 150 at lead 190 to adjust the gain of the IF section to keep the signal at lead 115 at a reasonably constant level for variations of source signal level at RF input terminal 110. The RF AGC control signal is coupled via lead 170 to RF AGC gain controllable amplifier 140. This AGC control signal is derived according to the present invention in response to the signal parameters, such as magnitude or signal to noise ratio at lead 115 and the non-linear distortion estimate from the demodulator 165. The gain control signals are configured in such a manner as to keep the signal level at the input of the A/D converter 155 at a relatively constant level and within the operating input range of the A/D converter 155 while improving signal quality.

Figure 2:
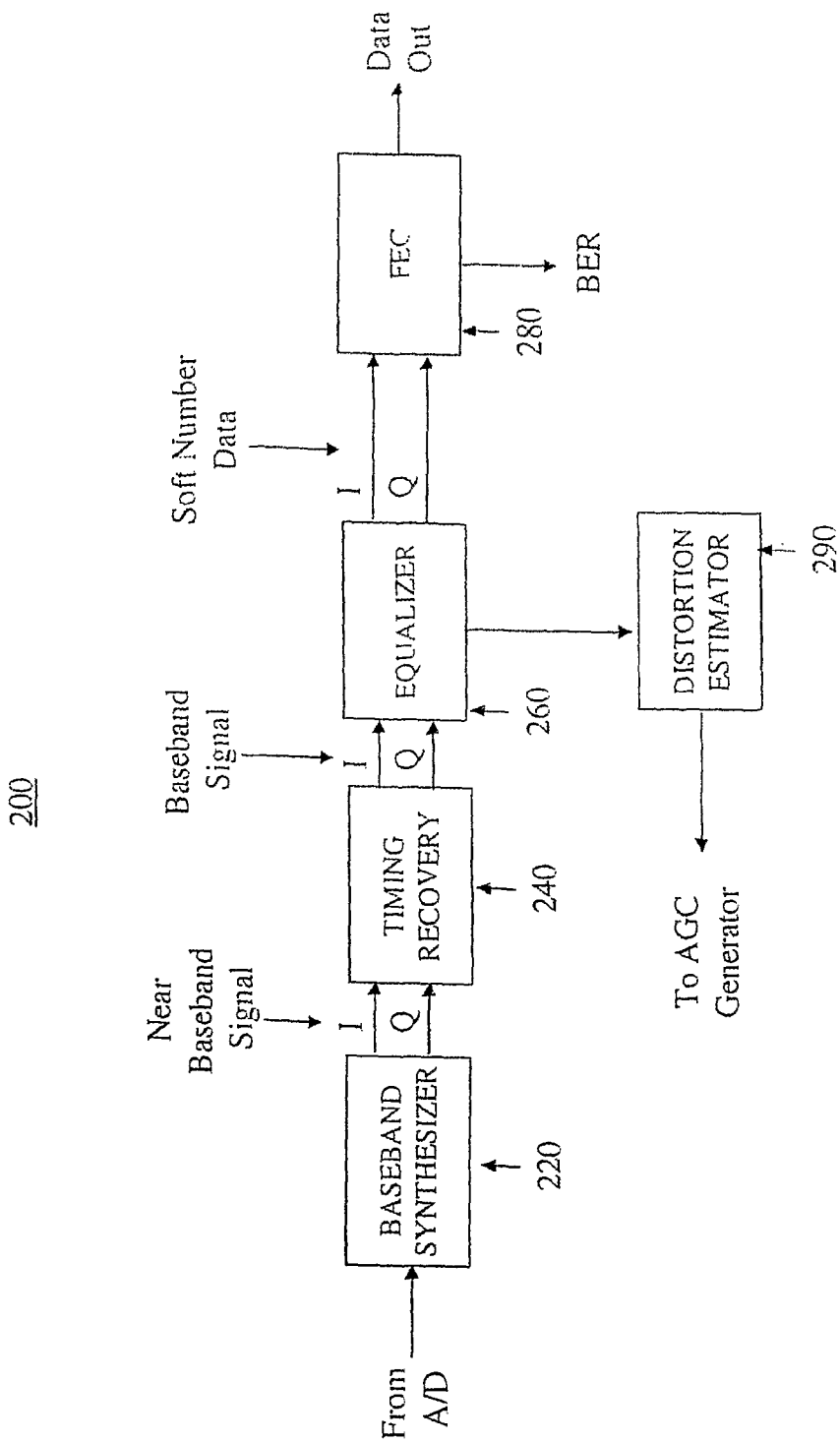
FIG. 2 is a block diagram of an exemplary embodiment of a digital demodulating apparatus for implementing the present invention.

Referring now to FIG. 2 a block diagram of an exemplary embodiment of digital demodulating apparatus for implementing the present invention is shown. The exemplary digital demodulator comprises a baseband synthesizer 220, a timing recovery circuit 240, and equalizer 260, a forward error correction (FEC) circuit 280, and a distortion estimator circuit 290.

An exemplary embodiment of a digital demodulator is shown in FIG. 2. The digital demodulator of this exemplary embodiment refers generally to the operation of a demodulator decoding a QAM signal, although the present invention could equally apply to any digital demodulation scheme. The demodulator receives a digitized IF signal from the A/D converter (155 of FIG. 1). The baseband synthesizer 220 converts the IF signal to a near baseband signal have signal components I (inphase) and Q (quadrature). The near baseband signal is supplied to the timing recover circuit 240 which is used to synchronize the timing of the demodulator circuit to the symbols of the incoming signals. The timing circuitry may use a continuously variable interpolation filter for sampling the input signal to generate a baseband signal. The baseband signal is then supplied to a equalizer 260. The equalizer 260 generates a soft number signal by compensating for different impairments encountered on the network, such as undesired amplitude-frequency or phase-frequency response. The soft number signal is supplied to the FEC circuit 280 which generates the desired data and a bit error rate signal. The equalizer 260 also generates the data used by the distortion estimator 290 in generating the control signal sent to the AGC generator (105 of FIG. 1) according to the present invention.

Figure 3:
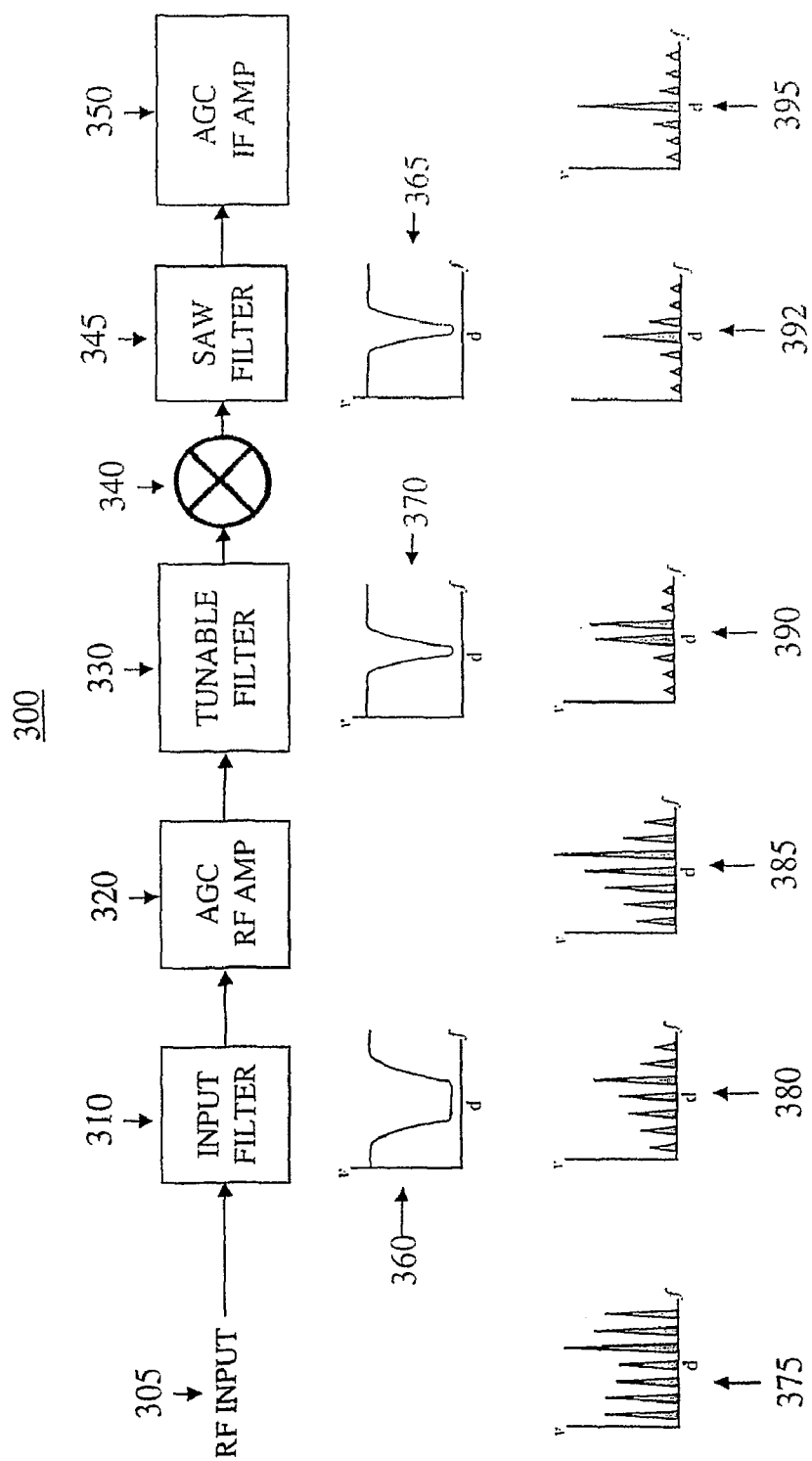
FIG. 3 is a block diagram of an exemplary embodiment of a preliminary signal processing circuit for implementing the present invention.

Referring now to FIG. 3 is a block diagram of an exemplary embodiment of a preliminary signal processing circuit for implementing the present invention. Environment 300 of FIG. 3 comprises an RF input 305 with a first exemplary representation 375 of an RF signal present at the RF input 305, an input filter 310, an exemplary embodiment of a attenuation profile 360 of the input filter and a second exemplary representation 380 of an RF signal present after the input filter 310, an automatic gain controlled RF amplifier 320 with a third exemplary representation 385 of an RF signal after the RF amplifier, an tunable filter 330 with an exemplary embodiment of the tunable filter attenuation profile 370 and a fourth exemplary representation 390 of an RF signal after the tunable filter, a mixer 340, a fixed frequency filter, 345, such as a SAW filter, with an exemplary embodiment of the fixed frequency filter attenuation profile 365 a fifth exemplary representation 392 of an RF signal after the fixed frequency filter 345 and a and an automatic gain controlled if amplifier 350 with a sixth exemplary representation 395 of an RF signal after the IF amplifier. According to an exemplary embodiment described herein, the aforementioned elements of environment 300 are operatively coupled to one another via a transmission medium such as traces on a printed circuit board, although other types of transmission mediums may also be used according to the present invention.

The RF input 305 is operative to supply an RF signal comprising one of more television channels each comprising one or more television programs. Some of these programs may be analog television signals in the NTSC standard format, while some programs may be digital television signals in the ATSC standard format employing a digital modulation scheme such as, but not limited to, either 8VSB, 16VSB or 256QAM modulation schemes. A representation of the RF signal spectrum of an exemplary RF signal is shown 375 depicting a plurality of television signals, each using a unique RF carrier frequency and having differing amplitudes at the RF input. These differing amplitudes may be a result of signal loss from propagation distance or differing antenna gains at the respective RF carrier frequencies. The RF signal is conducted from the RF input 305 to the input filter 310 which makes a first effort to reduced the undesired adjacent channel signals.

The input filter 310 typically uses tunable architecture to center the filter response on the desired RF frequency to minimize the attenuation of the desired channel and maximize the attenuation of adjacent channels. An exemplary embodiment of a attenuation profile 360 depicts the attenuation applied across the filter bandwidth, with the desired frequency being represented as d. The input filter 310 has a minimum attenuation at d and ideally increasing attenuation symmetrical around the desired frequency. An exemplary representation 380 of the RF signal present after the input filter 310 depicts minimal attenuation to the desired frequency d and increasing attenuation to the adjacent channels corresponding to the frequency response of the input filter 310. The RF signal is then conducted from the output of the input filter 310 to the input of the RF amplifier 320.

The gain of the RF amplifier 320 is in response to a control signal from the AGC generator 105 of FIG. 1. The RF amplifier 320 is not generally tuned in response to the desired frequency, so it amplifies all signals within its operating bandwidth, including the desired frequency, the adjacent channels as well as channels further from the desired frequency. The amplified channels maintain the same desired to undesired power ratio (D/U) to each other. The exemplary representation 385 of the RF signal present after being processed by the RF amplifier 320. In this exemplary embodiment, the strong adjacent channel is amplified along with the desired channel. According to a exemplary embodiment of the present invention, the gain of the RF amplifier 320 can be adjusted in response to the signal quality through a control signal generated by the AGC generator (105 of FIG. 1) The RF signal is then conducted from the output of the RF amplifier 320 to the input of the tunable filter 330.

The tunable filter 330 may be bandwidth controllable, have an center frequency that may be offset, or have an adjustable attenuation profile in response to the AGC generator (105 of FIG. 1) thereby adding an additional means in which to improve the signal quality by adjusting the response of the tunable filter 330 in response to the signal quality. An exemplary embodiment of a attenuation profile 370 of the tunable filter 330 depicts the attenuation applied across the filter bandwidth, with the desired frequency being represented as d. The tunable filter 330 has a minimum attenuation at d and ideally increasing attenuation symmetrical around the desired frequency. An exemplary representation 390 of the RF signal present after the tunable filter 330 depicts minimal attenuation to the desired frequency d and increasing attenuation to the adjacent channels corresponding to the frequency response of the tunable filter 330. When comparing the exemplary attenuation profiles 360, 370 of the input filter 310 and the tunable filter 330, that the tunable attenuation profile 370 has a narrower passband and a stronger out of band attenuation profile. The RF signal is then conducted from the output of the tunable filter 330 to the input of the RF mixer 340. The RF signal is mixed with the local oscillator signal to generate an RF signal whose carrier frequency is the desired IF frequency. The RF signal is then conducted from the output of the mixer 340 to the input of the fixed frequency filter 345 such as a SAW filter. The fixed frequency filter 345 generally has a strong out of band rejection characteristics. The output of the fixed frequency filter 345 is conducted to the AGC IF amplifier 350 after. A television tuner generally has a 44 MHz center frequency downstream IF.

The gain of the IF amplifier 350 is controlled in response to a control signal from the AGC generator 105 of FIG. 1. The IF amplifier 350 like the RF amplifier 320 amplifies all signals within its operating bandwidth, including the desired frequency, the adjacent channels as well as channels further from the desired frequency. In exemplary representation 395 of the RF signal present after being processed by the IF amplifier 350 is shown. According to a exemplary embodiment of the present invention, the gain of the IF amplifier 350 can be adjusted in response to the signal quality through a control signal generated by the AGC generator (105 of FIG. 1). The RF signal is then conducted from the output of the IF amplifier 350 to the input of the A/D converter (155 of FIG. 1) and one of the inputs of the AGC generator (105 of FIG. 1).

Figure 4:
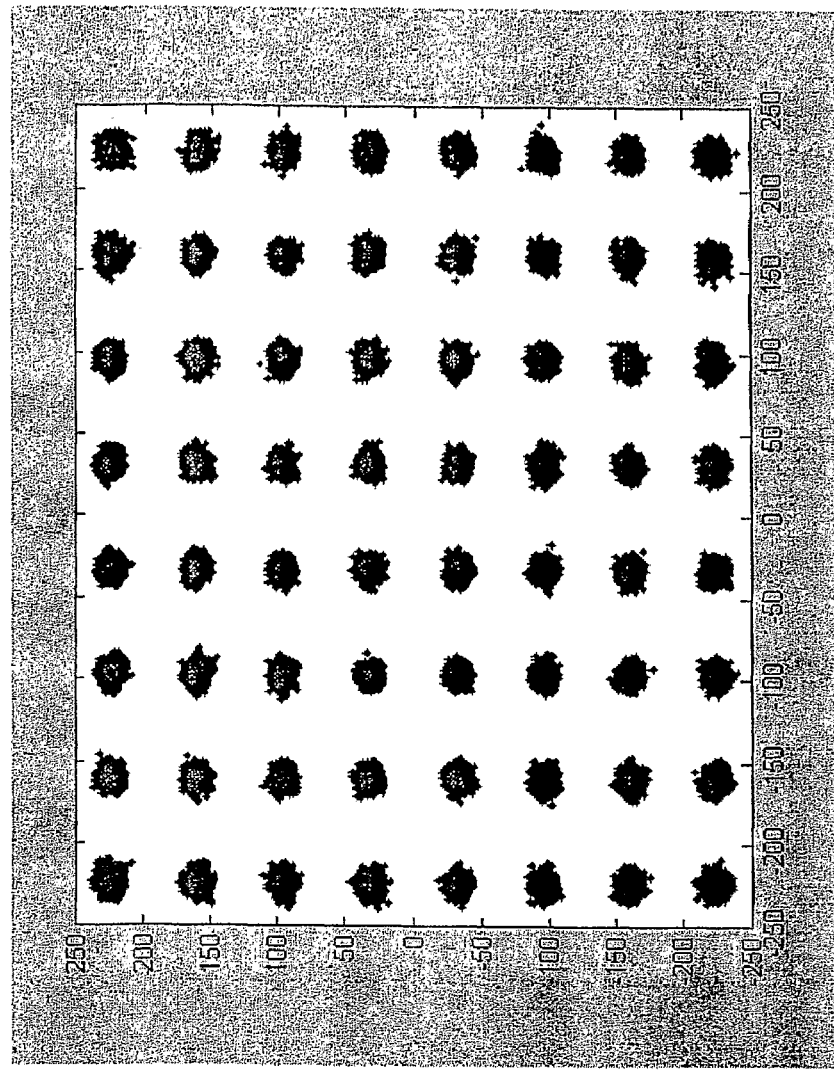
FIG. 4 is a diagram showing a signal constellation with Additive Gaussian White Noise present according to an exemplary embodiment of the present invention.

Referring now to FIG. 4 a diagram 400 showing a signal constellation with Additive Gaussian White Noise present according to an exemplary embodiment of the present invention is shown. The signal constellation represents a two dimensional representation of the soft number I and Q values output by the equalizer 260 of FIG. 1. In a signal constellation with Additive Gaussian White Noise present, each of the constellation point clusters have a Gaussian distribution and all clusters have approximately the same distribution.

Figure 5:
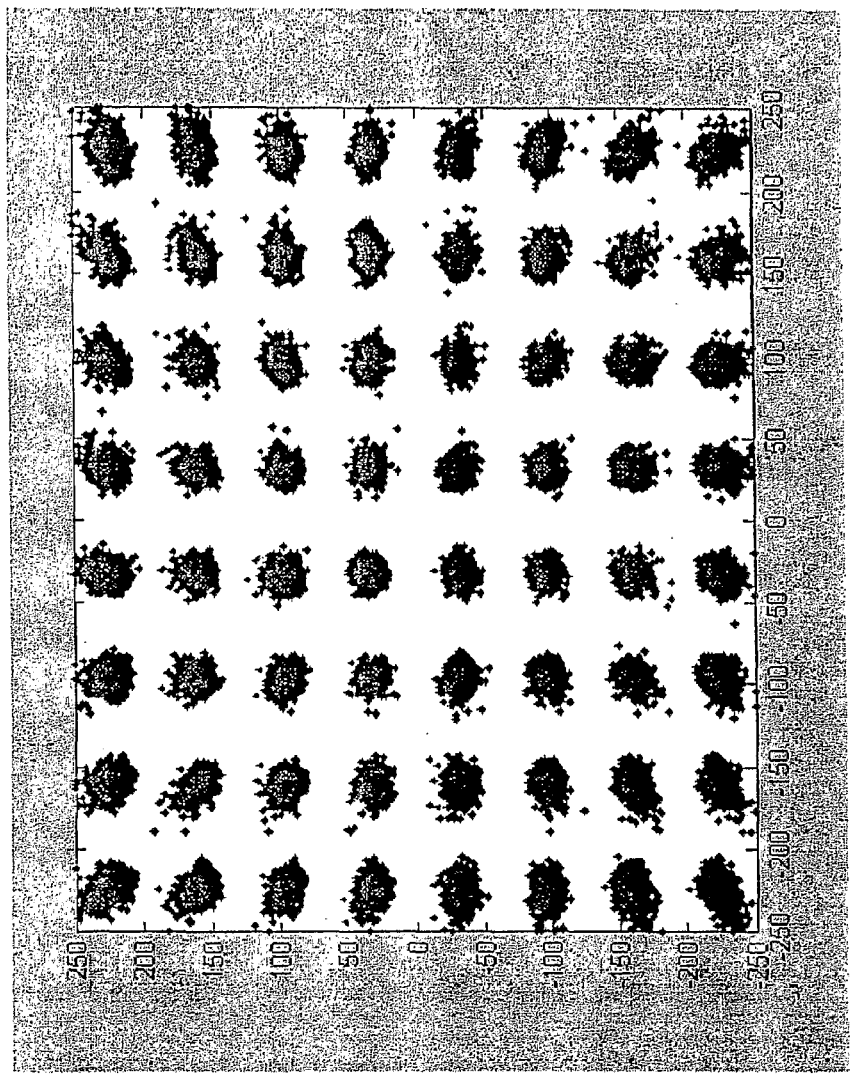
FIG. 5 is a diagram showing a signal constellation with Additive Gaussian White Noise and non-linear distortion present according to an exemplary embodiment of the present invention.

Referring now to FIG. 5 a diagram showing an exemplary signal constellation with Additive Gaussian White Noise and non-linear present according to an exemplary embodiment of the present invention is shown. The signal constellation represents a two dimensional representation of the soft number I and Q values output by the equalizer 260 of FIG. 1. In a signal constellation with Additive Gaussian White Noise present and a non linear distortion component, the constellation point clusters have a distinctly non-Gaussian distribution and each of the distributions are different. The distortion estimator 290 of FIG. 2, which may be an integral part of the equalizer 260 of FIG. 2, can use this non-Gaussian distribution of the signal constellation point clusters to detect the presence of non-linear distortion according to an exemplary embodiment of the present invention.

In a digital receiver, there is commonly a need to estimate the signal to noise ratio (SNR). One method of estimating the SNR is to use direct noise power estimation based on averaging error signal power used by the digital equalizer. The average signal power at the equalizer output is assumed a known entity and does not need to be estimated. Another method assumes the distribution of each constellation point cluster to be Gaussian and is based on finding, over a period of time, the number of constellation points that fall within a certain radius of the center of the constellation cluster or outside of a predetermined I value and Q value. The number of constellation points that fall within the limits as a percentage of the total number of constellation points received over the same time period can be used to estimate the average error power using a Gaussian Error Function. If the constellation is corrupted by AWGN only, the Gaussian noise distribution is a good approximation and both noise power, and therefore the SNR, estimation methods will, on average, yield comparable results. However, if there is also a non-linear distortion present, as represented in the exemplary signal constellation of FIG. 5, the assumption of Gaussian distribution is false and the second power estimation method will give a different value than the direct noise power estimation based on averaging error signal power. The degree of discrepancy will depend on the severity of the distortion. By using these two independent noise power SNR estimation methods simultaneously and comparing their average outputs, the presence and degree of non-linear distortion can be estimated.

The inverse Gaussian Error Function used in the second method of power estimation can be tabulated over the expected operating range of SNRs and efficiently implemented in hardware as a lookup table. Advantageously, both methods of estimation utilize circuitry which is commonly available within a traditional digital channel equalizer implementation.

If non-linear distortion is detected, the distortion estimator (290 of FIG. 2) can transmit a control signal to the AGC generator (105 of FIG. 1) which may alter the RF signal processing operation performed by the tuner, such as repartitioning the amplifier gains between the RF and IF sections or adjusting the filter response of the tunable filter (160 of FIG. 1). This altered operation may advantageously reduce the severity of the non-linear distortion. This reduction of non-linear distortion may outweigh the potential degradation due to the deviation from the gain partition based on signal characteristics of the analog signal. Furthermore, the A/D input voltage range could be limited to reduce the overall analog gain, thereby reducing or eliminating the requirement to change the gain partitioning or the filter responses.

Figure 6:
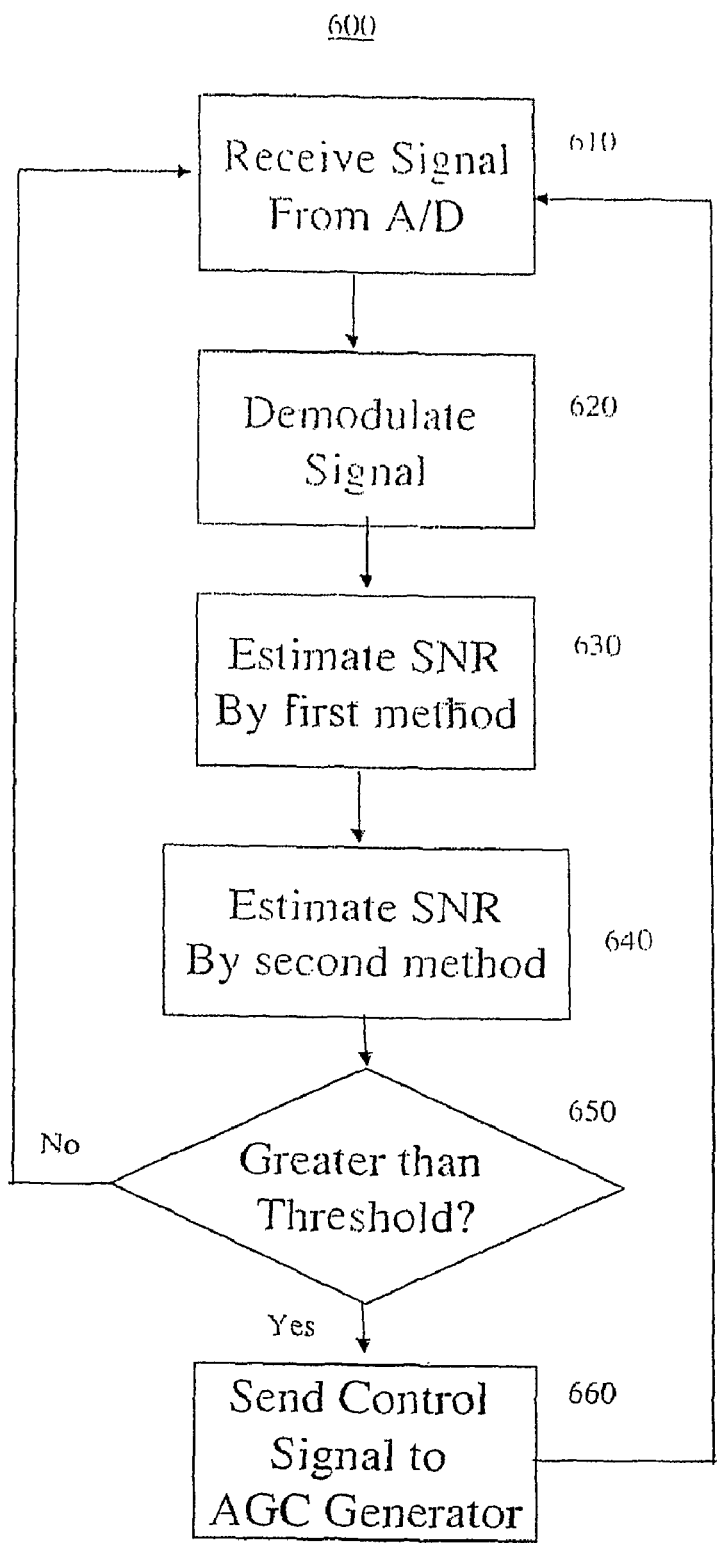
FIG. 6 is a flow chart illustrating an exemplary embodiment of a method of tuning and demodulating a signal according to an embodiment of the present invention.

Referring now to FIG. 6 is a flow chart 600 illustrating an exemplary embodiment of a method of tuning and demodulating a signal according to an embodiment of the present invention. The first step of estimating the non-linear distortion present in the RF signal is to receive the digital signal from the A/D converter 610. The digital signal is then demodulated 620 and a soft number estimation of the I and Q values are generated by the equalizer (260 of FIG. 2). The soft number value means that the exact value of I and Q is determined as it is received before error correction is performed on the signal, wherein said I and Q values generally comprise the transmitted values combined with a noise factor. For example, the transmitted values may be I=2 and Q=4, but after transmission, the equalizer generates soft number values of 2.2 and 3.7. Only after error correction further processing are the transmitted values determined to be 2 and 4 respectively. These soft number values are first used to determine the SNR 630 by direct noise power estimation based on averaging error signal power used by the digital equalizer. The soft number values of I and Q are then used to estimate the SNR by the second method 640. The second method determines, over a period of time, the number of constellation points that fall within a certain radius of the center of the constellation cluster or outside of a predetermined I value range and Q value range, such as plus or minus 10% for each value, for example. The ratio of the number of constellation points that fall within the limits as a percentage of the total number of constellation points received over the same time period is used to estimate the average error power, and thus, the SNR. The two independent noise power SNR estimation methods are compared 650 and a control signal responsive to the to the difference between the two SNR estimations is generated. If the value is below an acceptable threshold, the system sends no control signal to the AGC generator (105 of FIG. 1) and continues the process by receiving the signal from the A/D 601. However, if the value exceeds a permissible threshold, the control signal is transmitted to the AGC generator (105 of FIG. 1) where the RF signal processing operation may be altered in a manner to reduce the discrepancy between the two method of estimating the SNR. The operation is then continued by receiving the signal from the A/D 601. Alternately, the control signal responsive to the to the difference between the two SNR values can continuously be transmitted to the AGC generator (105 of FIG. 1) irrespective of the magnitude of the difference, and the AGC generator can use this information to optimize the processing of the RF signal. While the above exemplary embodiment of a method of tuning and demodulating a signal according to an embodiment of the present invention teaches the first and second methods of estimating the SNR can be performed sequentially, these operations can be performed sequentially or simultaneously.

As described herein, the present invention provides an architecture and protocol for non-linear signal distortion detection using multiple signal to noise ratio measurement sources. While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. An apparatus comprising:
   an input point receiving an RF signal;
   a frequency converter including a mixer and a local oscillator coupled to said input point operative to convert a gain-controlled version of said RF signal to an IF signal;
   a first gain-controlled amplifier coupled between said input point and said frequency converter operative to provide said gain-controlled version of said RF signal for said frequency converter;
   an analog-to-digital converter coupled to said frequency converter operative to digitize a gain-controlled version of said IF signal to a digitized IF signal;
   a second gain-controlled amplifier coupled between said frequency converter and said analog-to-digital converter operative to provide said gain-controlled version of said IF signal;
   an AGC generator coupled to said first and second gain-controlled amplifiers operative to adjust a gain of at least one of said first and second gain-controlled amplifiers in response to a degree of non-linear distortion;
   a demodulator coupled to said analog-to-digital converter demodulating said digitized IF signal,
   said demodulator being operative to estimate first and second signal-to-noise ratios independently,
   said first signal-to-noise ratio being estimated by direct noise power estimation based on averaging error signal power,
   said second signal-to-noise ratio being estimated based on the number of constellation points that fall within a radius of the center of a constellation cluster, and
   said demodulator being operative to compare said first and second signal-to-noise ratios for determining said degree of non-linear distortion.

2. The apparatus of claim 1, wherein
   said number of constellation points over a period of time is determined as a percentage of a total number of constellation points received over said period of time; and
   said degree of non-linear distortion is determined by comparing a degree of said first signal-to-noise ratio and a degree of said second signal-to-noise ratio represented as said percentage.

3. The apparatus of claim 1, wherein
   an absence of said non-linear distortion is detected when said estimation of said first signal-to-noise ratio and said estimation of said second signal-to-noise ratio yield on average substantially comparable results.

4. The apparatus of claim 1 wherein
   said demodulator estimates said first and second signal-to-noise rations simultaneously.

5. The apparatus of claim 1 wherein
   said demodulator estimates said first and second signal-to-noise rations sequentially.

6. A method comprising the steps of:
receiving an RF signal;
amplifying said RF signal for providing a gain-controlled version of said RF signal;
converting said gain-controlled version of said RF signal to an IF signal;
amplifying said IF signal for providing a gain-controlled version of said IF signal;
digitizing said gain-controlled version of said IF signal to a digitized IF signal;
demodulating said digitized IF signal;
adjusting a level of at least one of said gain-controlled versions of said RF and IF signals in response to a degree of non-linear distortion,
determining first and second signal-to-noise ratios independently, said first signal-to-noise ratio being estimated by direct noise power estimation based on averaging error signal power, said second signal-to-noise ratio being estimated based on the number of constellation points that fall within a radius of the center of a constellation cluster; and
comparing said first and second signal-to-noise ratios for determining said degree of non-linear distortion.

7. The method of claim 6, wherein
said number of constellation points over a period of time is determined as a percentage of a total number of constellation points received over said period of time; and
said degree of non-linear distortion is determined by comparing a degree of said first signal-to-noise ratio and a degree of said second signal-to-noise ratio represented as said percentage.

8. The apparatus of claim 6, wherein
an absence of said non-linear distortion is detected when said estimation of said first signal-to-noise ratio and said estimation of said second signal-to-noise ratio yield on average substantially comparable results.

9. The apparatus of claim 6 wherein
said demodulator estimates said first and second signal-to-noise rations simultaneously.

10. The apparatus of claim 6 wherein
said demodulator estimates said first and second signal-to-noise rations sequentially.

* * * * *